US008405192B2

(12) United States Patent
Huang et al.

(10) Patent No.: US 8,405,192 B2
(45) Date of Patent: Mar. 26, 2013

(54) LOW DIELECTRIC CONSTANT MATERIAL

(75) Inventors: Hsin-Yen Huang, Younghe (TW);
Ching-Yu Lo, Hsinchu (TW);
Hai-Ching Chen, Hsinchu (TW); Tien-I Bao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 290 days.

(21) Appl. No.: 12/893,374

(22) Filed: Sep. 29, 2010

(65) Prior Publication Data
US 2012/0074535 A1      Mar. 29, 2012

(51) Int. Cl.
*H01L 23/58*      (2006.01)
(52) U.S. Cl. ............... 257/632; 257/E21.576; 438/216; 438/287
(58) Field of Classification Search .............. None
See application file for complete search history.

(56) References Cited

U.S. PATENT DOCUMENTS

| 6,583,048 | B1 | 6/2003 | Vincent et al. |
| 6,846,515 | B2 * | 1/2005 | Vrtis et al. ............... 427/255.29 |
| 2008/0093646 | A1 * | 4/2008 | Lee et al. ...................... 257/314 |
| 2008/0193734 | A1 * | 8/2008 | Whitnall et al. .............. 428/221 |
| 2011/0049724 | A1 * | 3/2011 | Anderson et al. ............. 257/773 |

OTHER PUBLICATIONS

CSID:9264642, http://www.chemspider.com/Chemical-Structure.9264642.html (accessed 04:50, Sep. 11, 2012) Data sheet on 1,2-bis(triethoxysilyl)ethene.*

* cited by examiner

*Primary Examiner* — Tan N Tran
*Assistant Examiner* — Scott R Wilson
(74) *Attorney, Agent, or Firm* — Haynes and Boone, LLP

(57) ABSTRACT

The present disclosure provides a dielectric material including a low dielectric constant material and an additive. The additive includes a compound having a Si—X—Si bridge, where X is a number of carbon atoms between 1 and 8. The additive may include terminal Si—$CH_3$ groups. The dielectric material including the additive may be used as an interlayer dielectric (ILD) layer of a semiconductor device. The dielectric material including the additive may be formed using a CVD or sol-gel process. One example of the additive is bis(triethoxysilyl)ethene.

19 Claims, 7 Drawing Sheets

LOW DIELECTRIC CONSTANT MATERIAL

BACKGROUND

The present disclosure is directed to low dielectric constant materials, which may be used as insulating layers in semiconductor or other electronic devices.

Semiconductor fabrication technologies typically use dielectric materials as insulating layers between circuits and components of circuits (e.g., integrated circuits). As but one example, dielectric materials are typically used between interconnection layers of a multilayer interconnect structure of a semiconductor device. Dielectric materials in this application are commonly referred to as interlayer dielectric (ILD). As dimensions decrease in semiconductor device components, the requirements to isolate adjacent features from one another becomes more critical, and more difficult. To meet these challenges, the industry has turned to low dielectric constant materials as opposed to the traditional use of silicon dioxide as ILD layers. However, formulations of low dielectric constant (low-k) materials often have other disadvantages such as poor mechanical strength, de-lamination, damage induced by etching (e.g., plasma) processes, and the like.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

U.S. Pat. No. 6,583,048 describes organosilicon precursors for interlayer dielectric films. U.S. Pat. No. 6,846,515 describes methods for using porogens and/or porogenated precursors to provide porous organosilica glass films with low dielectric constants. Both patents are hereby incorporated by reference in their entirety. The interlayer dielectrics of these references may be used as the low-k dielectric of the present application, with which the described additive is combined, as further described below.

This disclosure is directed to an additive which may be combined with a dielectric material (e.g., a low dielectric constant (low-k) material). In some embodiments, the additive provides for mitigating plasma damage in low-k dielectric layers (e.g., in etching interlayer layer dielectrics (ILD) also known as intermetal layer dielectrics (IMD)). In some embodiments, the additive also provides for an increase in the mechanical strength of a low-k dielectric material, such as a porous low-k material.

The additive may increase the carbon content of the resulting dielectric material. Increased carbon can serve to mitigate and/or eliminate etch damage to low-k dielectric layers. The carbon content of previously known embodiments can decrease the mechanical strength of the low-k material, e.g., porous low-k material (see, e.g., U.S. Pat. Nos. 6,583,048 and 6,846,515). This weakening of the porous inter-layer dielectrics can cause process issues such as, peeling after chemical mechanical polishing of the substrate or cracking of the dielectric after packaging. Thus, an improved low-k dielectric is needed. One or more embodiments of the dielectric having the described additive may fulfill one or more of these needs.

Figure 1:
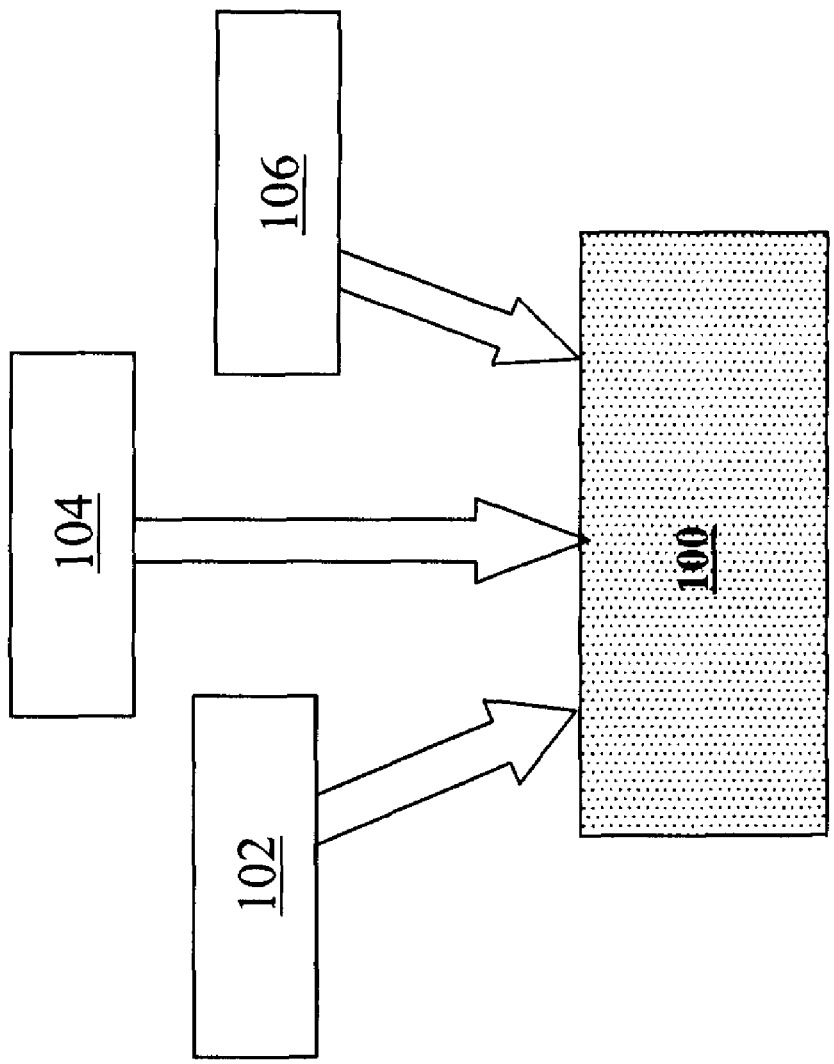
FIG. 1 is block diagram of a dielectric material according to an embodiment of the present disclosure.

FIG. 1 is a block diagram illustrating a dielectric 100 according to an embodiment of the present disclosure. The dielectric 100 may be held and/or formed in a chamber such as, a chemical vapor deposition (CVD) chamber, a container used in a sol-gel process, and/or other apparatus that can mix and/or hold chemicals. The dielectric 100 may be formed on a semiconductor substrate (see, e.g., FIG. 3). The dielectric 100 includes (e.g., is formed of) a plurality of components including a low-k dielectric material 102 and an additive 104. In the illustrated embodiment, the dielectric 100 further includes a porogen precursor 106; however, in other embodiments the precursor 106 may be omitted. Other components may be included in the dielectric 100 such as, inorganic acids, surfactants, alcohol (e.g., ethanol), water, and the like.

In an embodiment, the low-k dielectric 102 is an extreme low-k dielectric (ELK). The ELK material may have a dielectric constant of less than about 2.5. Example ELK materials include porous low-k materials. In an embodiment, the ELK is a silicon oxide based low-k material having a porous structure, which is adapted to a porogen-doped SiCO-based material by incorporating the porogen 106 into a carbon-doped oxide dielectric. In an embodiment, the low-k dielectric 102 is an organosilica glass. Further examples of the low-k dielectric 102 are described below. The porogen 106 may be any suitable a pore generating material, such as a hydrocarbon. In an embodiment, the low-dielectric 102 is diethoxymethysilane. In an embodiment, the porogen precursor 106 has the structure $C_xH_y$. The low-k dielectric 102 and/or the porogen precursor 106 may be substantially similar to embodiments described in U.S. Pat. Nos. 6,846,515 and 6,583,048, incorporated by reference above.

Other suitable materials for the low-k dielectric material 102 include, but are not limited to, doped silicon dioxide, fluorinated silica glass (FSG), carbon-doped silicon dioxide, porous silicon dioxide, porous carbon-doped silicon dioxide, SiLK (a organic polymeric dielectric distributed by Dow Chemical of Michigan), Black Diamond (a product of Applied Materials of Santa Clara, Calif.), Xerogel, Aerogel, amorphous fluorinated carbon, Parylene, bis-benxocyclo-cutenes (BCB), polyimide, polynoroboneses, benzocyclo-cutene, PTFE, porous SiLK, hydrogen silsesquioxane (HSQ), methylsilsesquioxane (MSQ), and/or combinations thereof.

The additive 104 may include a molecular structure with Si—X—Si bridges (e.g., bonds), where X is between 1 and 8 carbon atoms. In an embodiment, the additive 104 includes a molecular structure of Si—C—C—Si. However, any number of carbon atoms may be possible. The additive 104 may include a molecular structure with include terminal Si—$CH_3$ groups.

The additive 104 increases the carbon content of the dielectric material 100 from that which it would have had if including only the low-k dielectric 102 and/or porogen precursor 106. In an embodiment, the additive 104 provides for an increase in carbon of between approximately 10% to approximately 30% by atomic concentration percentage. In an embodiment, the atomic concentration percentage is determined by an x-ray photoelectron spectroscopy (XPS). In an embodiment, the dielectric material 100 has a carbon content of greater than approximately 15% atomic concentration percentage. In an embodiment, the dielectric material 100 has a carbon content between approximately 15% and approximately 23% atomic concentration percentage.

The additive 104 may increase the mechanical strength or hardness of the dielectric material 100 from that which it would have had if including only the low-k dielectric 102 and/or the porogen precursor 106. In an embodiment, the additive 104 provides for an increase in hardness of between approximately 20% to approximately 40% (e.g., as measured by a nanoindentor). In an embodiment, the dielectric 100 has a hardness between approximately 1.0 to approximately 3.0 GPa.

The additive 104 may lower the dielectric constant of the dielectric material 100 from that which it would have been if it had included only the low-k dielectric 102 and/or porogen precursor 106. In an embodiment, the dielectric 100 has a dielectric constant between approximately 1.8 and approximately 2.6.

The dielectric 100 may have a higher mechanical strength than the dielectric material 102 (and/or the combination of the dielectric material 102 and the porogen 104). The higher mechanical strength may be attributed to the molecular structures including Si—C—C—Si bridge bonding. Though discussed herein as including two carbon atoms in the bridge, a greater number of carbons may be possible as described above. The increase in carbon content may be achieved by the molecular structures including Si—C—C—Si bridge bonding and terminal Si—$CH_3$ groups. The Si—C—C—Si bridge bonding and terminal Si—$CH_3$ groups may enhance the resistance of the dielectric 100 to etch (e.g., plasma) damage.

In an embodiment, the additive 104 is bis(triethoxysilyl) ethene or BTSE. In an embodiment, the additive 104 is 1-(triethoxysilyl)-2-(diethoxymethylsilyl)ethene (CAS number: 18418-54-7). In an embodiment, the additive 104 is bis(diethoxymethylsilyl)ethene (CAS number: 18043-74-8). In an embodiment, the additive 104 is bis(diacetoxymethyl)ethylenesilane (CAS number 14971-02-9). In an embodiment, the additive 104 is a combination of one or more of bis(triethoxysilyl)ethene, 1-(triethoxysilyl)-2-(diethoxymethylsilyl)ethene, bis(diethoxymethylsilyl)ethene, bis(diacetoxymethyl)ethylenesilane, and/or other suitable components. It is noted that the above embodiments are illustrative only and not intended to be limiting. The additive 104 may be any component with a Si—X—Si bridge, where X is 1 or greater carbon atoms. In an embodiment, the component including the Si—X—Si bridge is a monomer. The additive 104 may also include terminal Si—$CH_3$ group. In one or more embodiments, one of the terminal groups (e.g., alkoxy) of the above described exemplary additives may be replaced by a methyl ($CH_3$) group to provide a terminal Si—$CH_3$ group.

Figure 2:
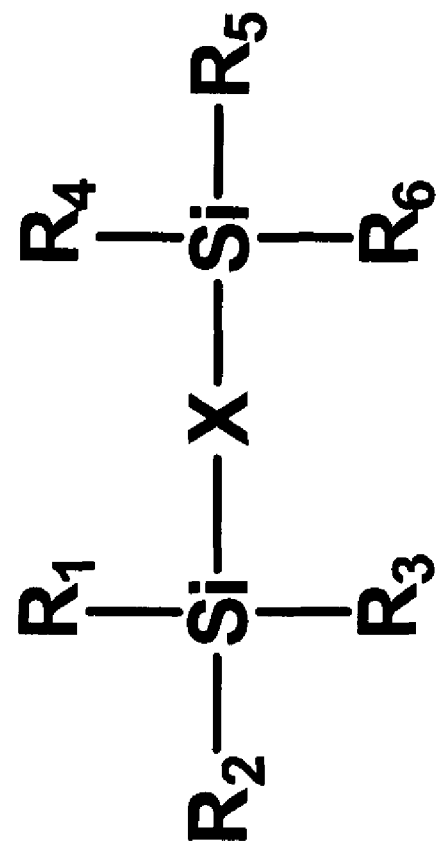
FIG. 2 is a molecular diagram of an embodiment of an additive for dielectric material according to one or more aspects of the present disclosure.

FIG. 2 illustrates an embodiment of the structural formula of the additive 104. In FIG. 2, X refers to —$(CH_2)_n$—, where n is a number between 1 and 8. In an embodiment, n is two. R1 to R6 are alkoxy, alkyl, or hydrogen. Each of R1 to R6 maybe independent selected (e.g., may be different or the same as one another). In each of R1 to R6, the number of carbons may be between 1 and 12. Each of R1 to R6 may include a structure of alkoxy or alkyl substituent which can be linear, branched saturated, singly or multiply unsaturated, cyclic or aromatic, and/or other suitable configurations.

The additive 104 may be added to the low-k dielectric 102 (and/or mixture of low-k dielectric 102 and precursor 106) in a chemical vapor deposition (CVD) chamber or in a sol-gel process. In an embodiment, the additive 104 may be added to the low-k dielectric 102 to provide a spin-on-dielectric (SOD) solution.

In an embodiment, the dielectric 100 is prepared via a sol-gel process. For example, a low-k material 102 may be mixed with a precursor (including the porogen precursor 106), inorganic acid, surfactant, ethanol, water, and/or the additive 104. The mixture may be sufficient mixed as to give a homogenous solution. The homogeneous material (e.g., dielectric 100) is then spin-coated onto semiconductor wafers. In an embodiment, the dielectric 100 is spin-coated at approximately 1000 to approximately 2000 revolutions per minute (RPM). In an embodiment, the spin-on process is followed by a post-treatment. Example post-treatments include ultra-violet (UV) curing.

In an embodiment, the dielectric 100 is prepared via a chemical vapor deposition (CVD) process. In a further embodiment, the dielectric 100 is prepared using a plasma-enhanced CVD (PECVD) process. As but one example, the flow rate of each of the gaseous reagents range between approximately 10 and approximately 5000 standard cubic centimeters per minute (sccm). In an embodiment, the gaseous reagents range between approximately 30 and approximately 1000 sccm. Further process condition examples include a pressure in the vacuum chamber of the CVD tool of approximately 0.01 to 600 torr, or in another embodiment, between approximately 1 and 15 torr. The plasma power may be between 100 to 1000 watts in some embodiments, or more particularly between approximately 300 to 600 watts. The above described process conditions are exemplary only and not intended to be limiting.

Figure 3:
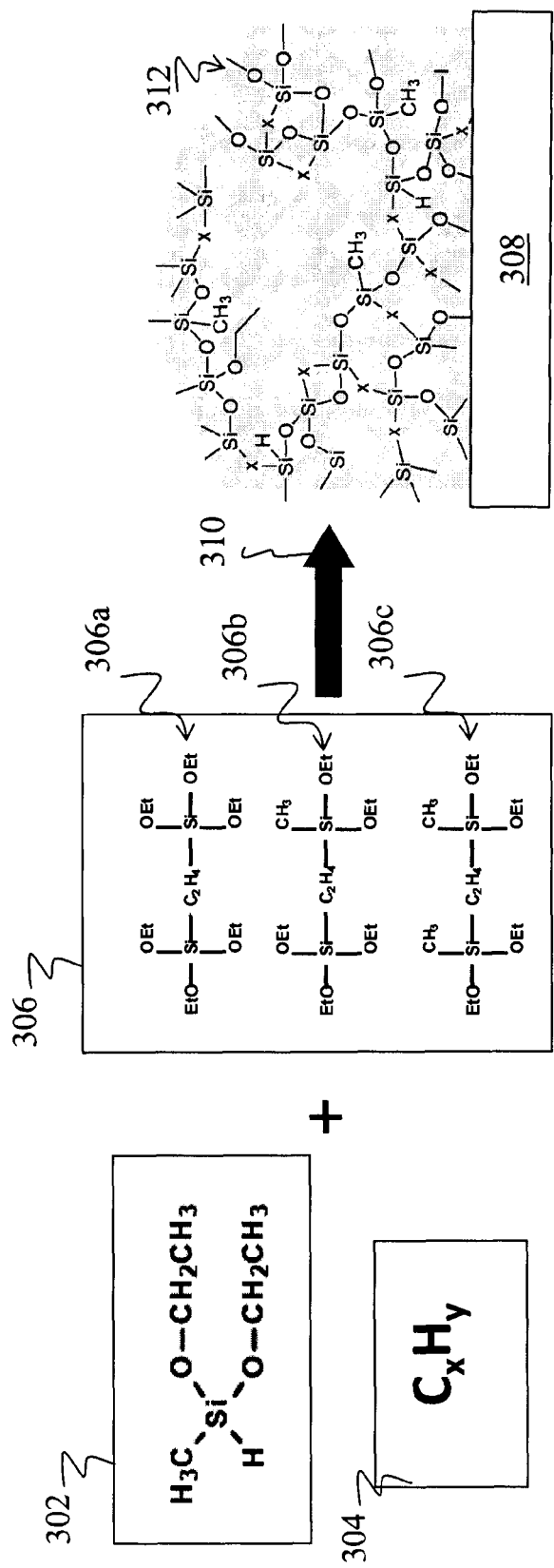
FIG. 3 is a block diagram of an embodiment of forming a dielectric material layer according to an embodiment of the present disclosure.

FIG. 3 illustrates an embodiment of forming of a dielectric and providing a dielectric layer on a substrate. A low-k dielectric 302 and a porogen precursor 304 are combined with an additive 306. The low-k dielectric 302 is illustrated as diethoxymethylsilane, but in other embodiments may be substantially similar to any of the embodiments of the low-k dielectric material 102, described above with reference to FIG. 1. The porogen precursor 304 may be substantially similar to porogen 106, described above with reference to FIG. 1. The additive 306 includes three chemical structures illustrated as 306a, 306b, and 306c. The additive 306 is illustrated as including bis(triethoxysilyl)ethene (see 306a), however numerous other embodiments are possible including those substantially similar to the embodiments described above with reference to the additive 104, described above with reference to FIG. 1. It is noted that the additive 306 provides an exemplary embodiment of the chemical structure 200, depicted in FIG. 2. Additive components 306b and 306c include terminal Si—CH$_3$ groups. In an embodiment, the additive components 306b and 306c are provided by substituted methyl (CH$_3$) groups for the ethoxy (EtO) terminal groups of the bis(triethoxysilyl)ethene 306a.

The additive 306, low-k dielectric 302 (e.g., diethoxymethylsilane), and porogen precursor 304 (e.g., hydrocarbon CxHy) are combined and deposited onto a substrate 308. The substrate 308 is a semiconductor substrate. The semiconductor substrate 308 includes silicon. Alternatively, the substrate 308 includes germanium, silicon germanium or other suitable semiconductor materials. In an embodiment, a treatment 310 is performed on dielectric material. In an embodiment, the treatment 310 is a UV lamp treatment. The treatment may remove the porogen and/or fortify the structure of a formed dielectric layer 312

The formed dielectric layer 312 is illustrated on the semiconductor substrate 308. The X provided in the layer illustrates a C—C bond. As illustrated by the dielectric layer 312, a plurality of Si—C—C—Si bonds is formed. The dielectric layer 312 may be substantially similar to the interlayer dielectric layer 720, described below with reference to FIG. 7.

Figure 4:
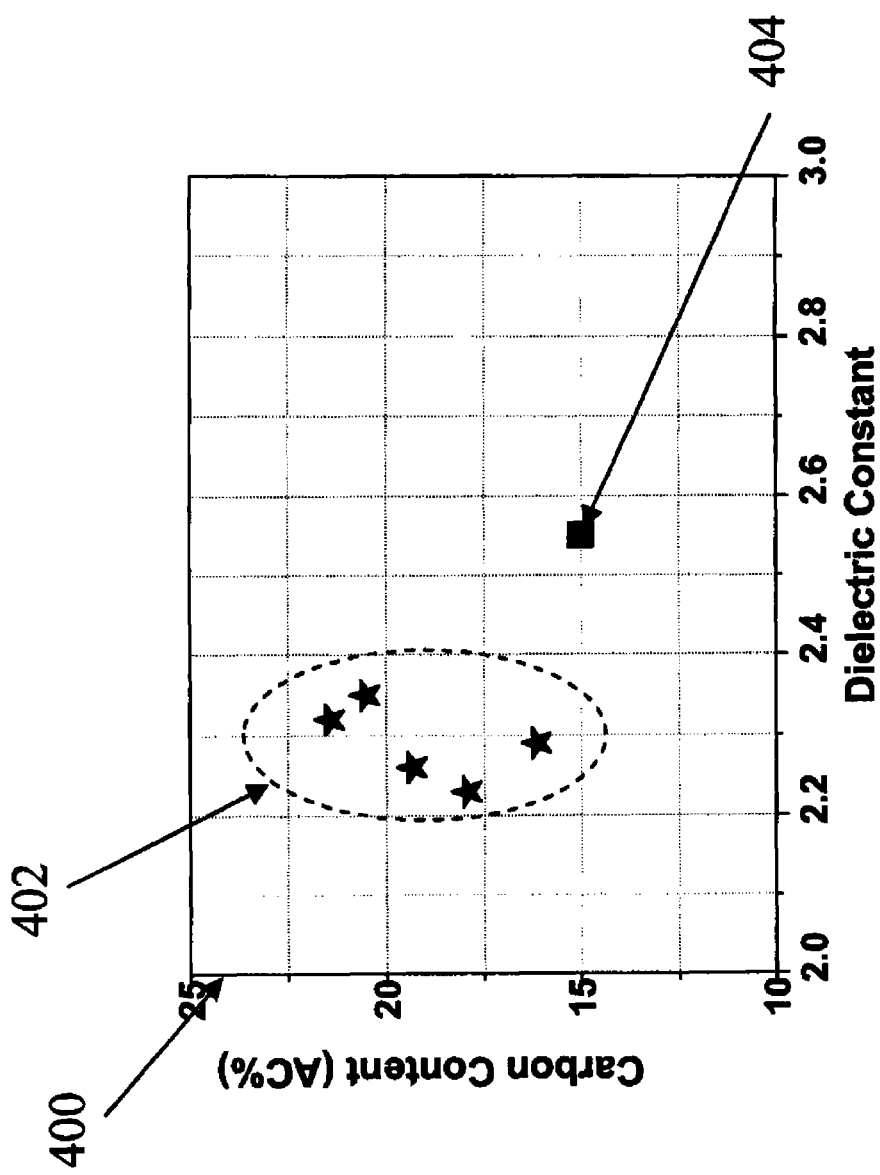
FIGS. 4 and 5 illustrate graphs of experimental embodiment of a dielectric material including an additive as compared to a conventional dielectric material.
Figure 5:
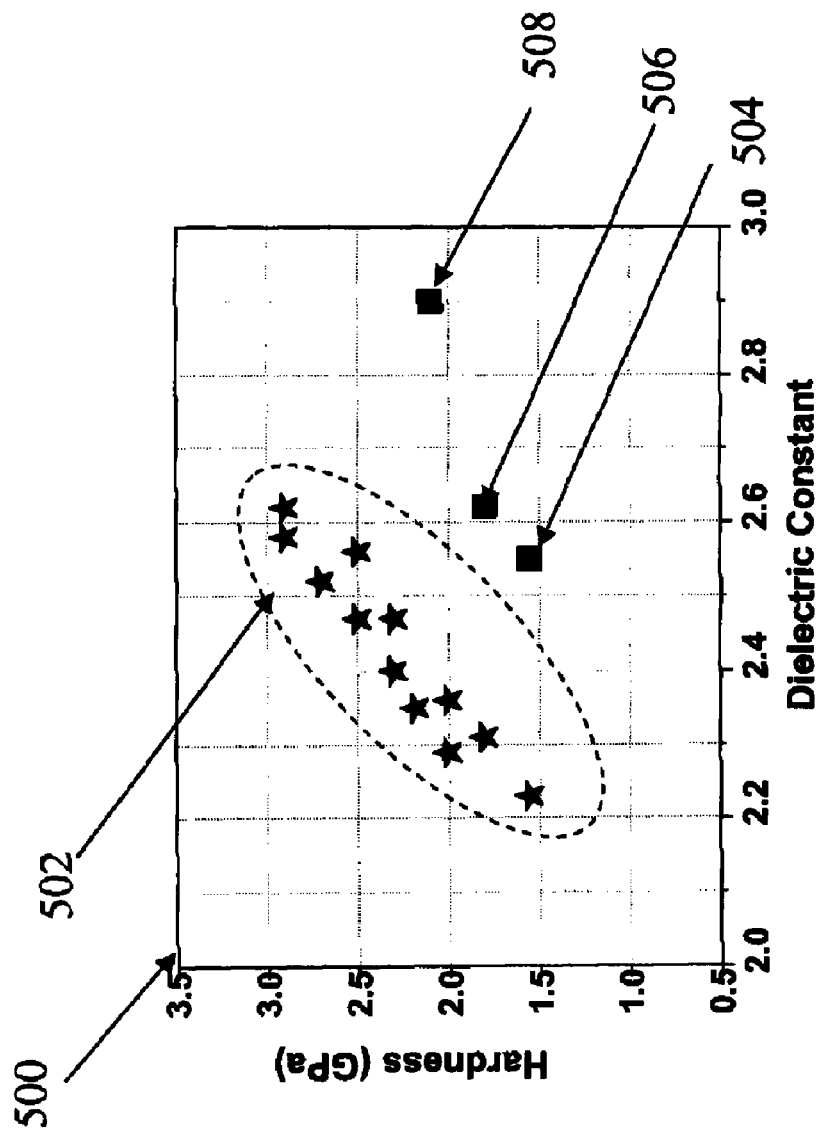

FIGS. 4 and 5 illustrate graphs of experimental embodiments of dielectric material including an additive, according to one or more aspects of the present disclosure. Graph 400 illustrates a plurality of dielectric materials 402, each which include an additive. The additive may be substantially similar to the additive 104, additive 200, and/or additive 306, described above with reference to FIGS. 1, 2, and 3 respectively. The dielectric materials 402 each provide a different carbon content (e.g., amount or type of additive is varied as between dielectric materials 402) as measured in atomic concentration percentage. As illustrated by the graph 400, each of the dielectric materials 402 has a dielectric constant that is less than that of a conventional extreme-low k (ELK) material 404. In an embodiment, the dielectric materials 402 include same material as the conventional low-k material 404 with the addition of an additive.

Graph 500 illustrates a plurality of dielectric materials 502 each of which include an additive. The additive may be substantially similar to the additive 104, additive 200, and/or additive 306, described above with reference to FIGS. 1, 2, and 3 respectively. The dielectric 504 and 506 are first and second conventional extreme low-k dielectric (ELK); the dielectric 508 is a conventional Black Diamond dielectric. As illustrated by graph 500, each of the dielectric materials 502 has a dielectric constant that is less than that of the conventional materials 504, 506, and 508 at a given hardness (GPa). In an embodiment, the dielectric materials 502 include the same dielectric material as the conventional low-k materials 504, 506, and/or 508, with the addition of an additive.

Figure 6:
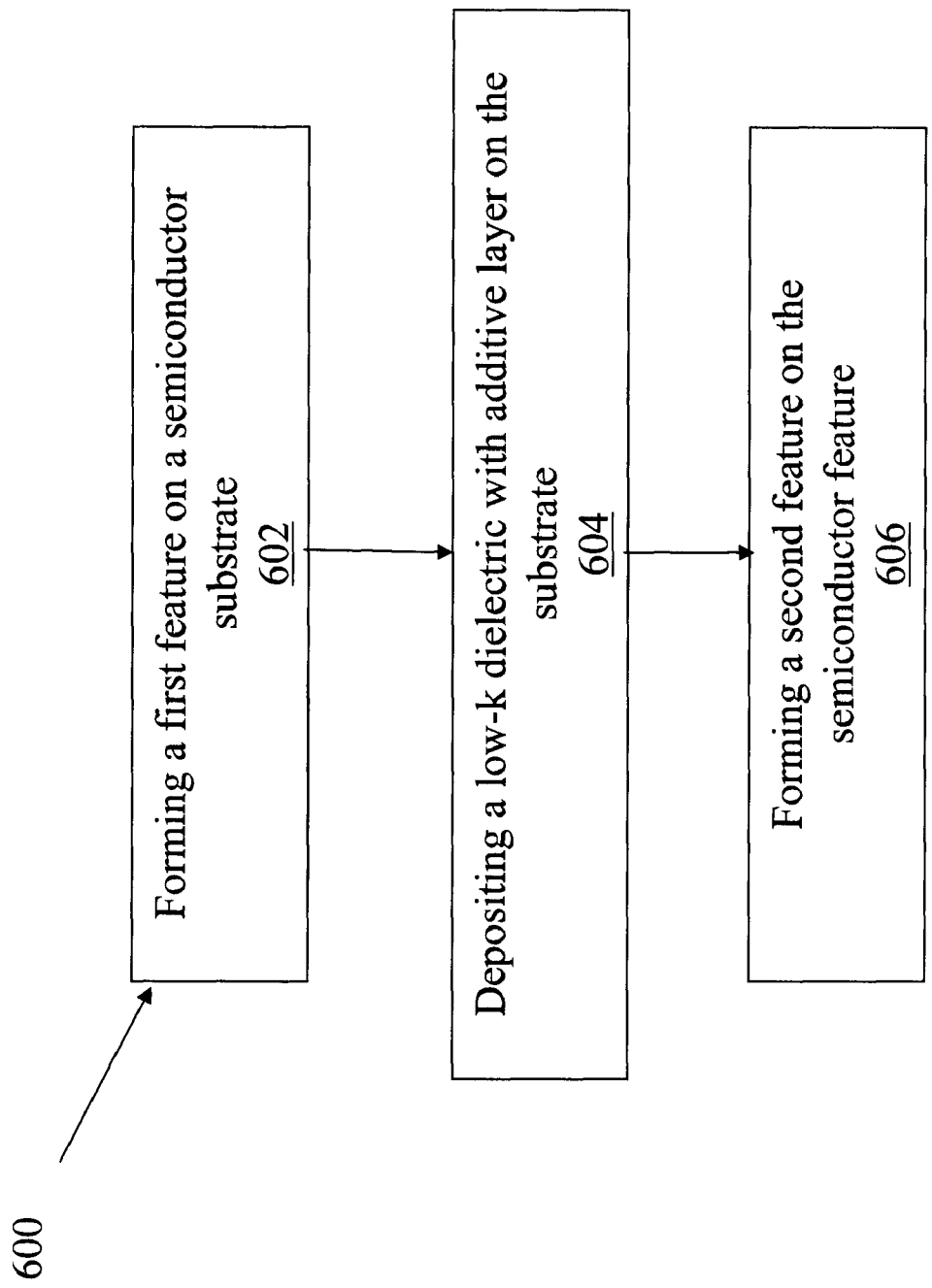
FIG. 6 is a flow chart illustrating an embodiment of forming a dielectric layer on a substrate including one or more aspects of the present disclosure.

Referring now to FIG. 6, illustrated is a method 600 of fabricating a semiconductor device including a low-k dielectric with additive layer. The method 600 begins at step 602 where a first feature is formed on a semiconductor substrate. The semiconductor substrate may include silicon. Alternatively, the substrate may include germanium, silicon germanium or other proper semiconductor materials. The feature formed may include any feature of an active or passive semiconductor device. Such features include, but are not limited to, isolation features, gate features including raised source/drain regions, finFET gates, source/drain features, doped regions such as n-wells and p-wells including those forming photodiodes, interconnect features including multiple layer interconnects (MLI) having vias/plugs and lines, and/or various other features known in the art. The first feature may be a feature or portion thereof associated with memory cells and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, bipolar transistors, high voltage transistors, high frequency transistors, micro-electromechanical system (MEMS) devices, and/or various other suitable devices. The first feature may be formed using suitable process including those typical to a CMOS-based process such as patterning, etching, deposition, and implantation.

The method 600 then proceeds to step 604 where a low-k dielectric layer is formed on the substrate, wherein the low-k dielectric layer includes an additive. The additive may be substantially similar to the additive 104, 200, and/or 306 described above with reference to FIGS. 1, 2, and/or 3 respectively.

In an embodiment, the low-k dielectric with additive material is prepared via a sol-gel process. The low-k dielectric with additive material is then spin-coated onto a semiconductor substrate (e.g., wafer). In an embodiment, the low-k dielectric with additive material is spin-coated at approximately 1000 to approximately 2000 revolutions per minute (RPM). In an embodiment, the spin-on process is followed by a post-treatment such as ultra-violet (UV) curing.

In an embodiment, the low-k dielectric with additive material is deposited via a chemical vapor deposition (CVD) process. In an embodiment, the low-k dielectric with additive material is deposited using a plasma-enhanced CVD process (PECVD). As but an example, the flow rate of each of the gaseous reagents range between approximately 10 and approximately 5000 sccm. In an embodiment, the gaseous reagents range between approximately 30 and approximately 1000 sccm. Further process condition examples include a pressure in the vacuum chamber of the CVD tool of approximately 0.01 to 600 torr, or in another embodiment, between approximately 1 and 15 torr. The plasma power of a PECVD process may be between approximately 100 to 1000 watts in some embodiments, or more particularly between approximately 300 to 600 watts. The above described process conditions are exemplary only and not intended to be limiting.

In an embodiment, a low-k dielectric with additive layer is formed on the semiconductor substrate to provide an interlayer (or inter-metal layer) dielectric (ILD). In an embodiment, the low-k dielectric with additive layer is formed overlying a gate feature on the semiconductor substrate isolating one or more gate features (e.g., an ILD0 layer). In other embodiments, the low-k dielectric with additive layer forms a subsequent ILD layer of a multi-layer interconnect (MLI) structure.

The method 600 then proceeds to step 606 where a second feature is formed on a semiconductor substrate. The feature formed may include any feature of an active or passive semiconductor device. Such features include, but are not limited to, isolation features, gate features including raised source/drain regions, finFET gates, source/drain features, doped regions such as n-wells and p-wells including those forming photodiodes, interconnect features including multiple layer interconnects (MLI) having vias/plugs, contacts, and lines, and/or various other features known in the art. The second feature may be a feature or portion thereof associated with memory cells and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, bipolar transistors, high voltage transistors, high frequency transistors, micro-electromechanical system (MEMS) devices, and/or various other suitable devices. The second feature may be formed using suitable process including those typical to a CMOS process such as patterning, etching, deposition, and implantation.

In an embodiment, forming the second feature includes planarizing the low-k dielectric with additive layer using a chemical mechanical polishing (CMP) process. In an embodiment, after CMP, holes may be patterned and etched in the low-k dielectric with additive layer, which are then filled with conductive material (e.g., tungsten). In an embodiment, the plugs form contacts to features including the first feature described above.

Figure 7:
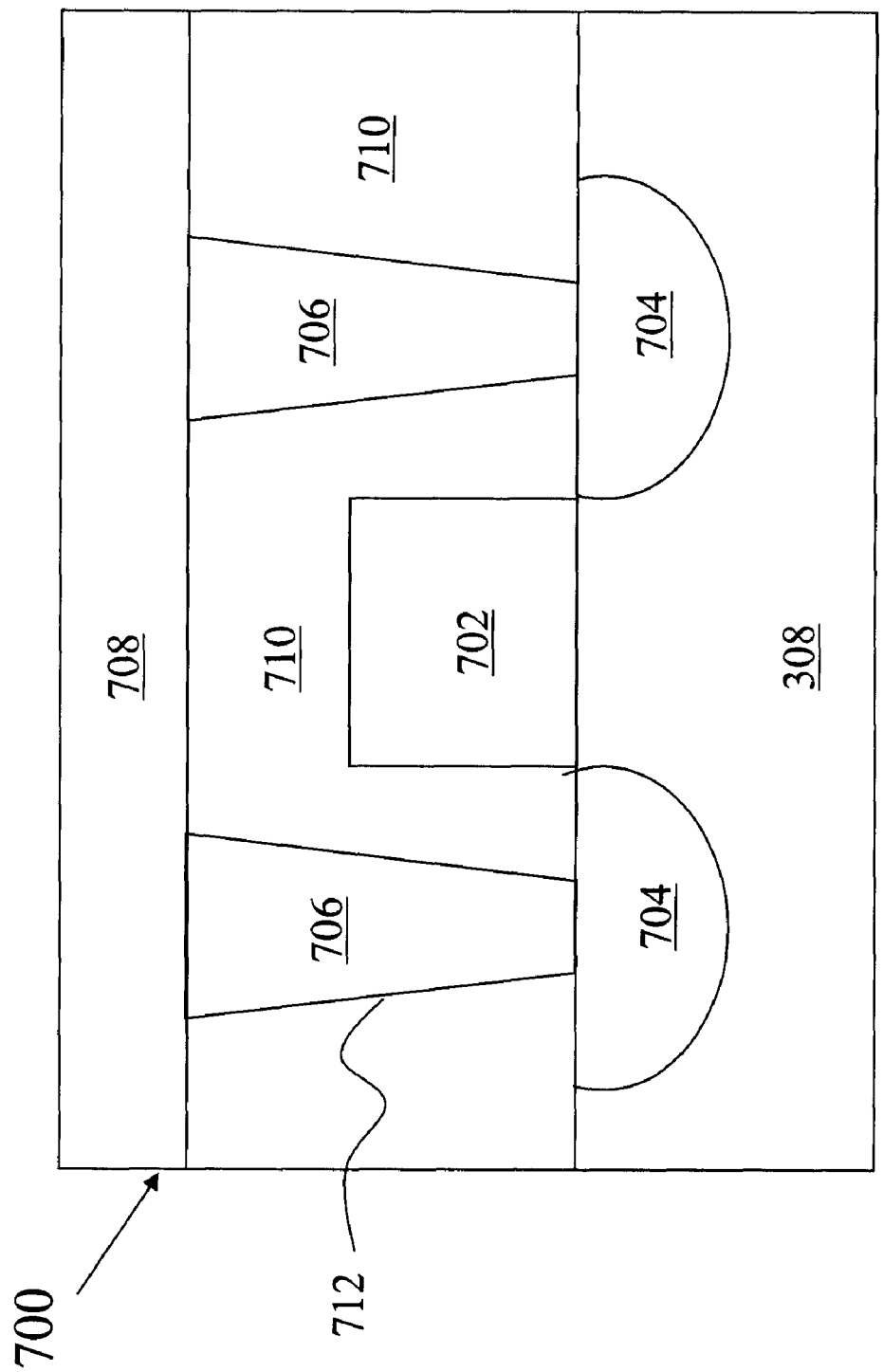
FIG. 7 is a cross-sectional view of an embodiment of a semiconductor device having a dielectric layer according to one or more aspects of the present disclosure.

Referring now to FIG. 7, illustrated is a semiconductor device 700. The device 700 may be an intermediate device fabricated during processing of an integrated circuit, or portion thereof, that may comprise memory cells and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof.

The semiconductor device 700 includes a semiconductor substrate 308, a gate feature 702, source/drain features 704, contacts 706, a metal line 708, and an interlayer dielectric (ILD) layer 710. The semiconductor substrate 308 may be substantially similar to as discussed above with reference to FIG. 3. The gate feature 702, source/drain features 704, contacts 706, and metal line 708 are typical features of a semiconductor device and may be formed using processes typical of a CMOS-based fabrication process and thus, are not described in detail herein.

The ILD layer 710 includes a low-k dielectric with additive material. The ILD layer 710 may include a material substantially similar to the dielectric 100, described above with reference to FIG. 1. The ILD layer 710 includes an additive; the additive may be substantially similar to the additive 104, 200, and/or 306, described above with reference to FIGS. 1, 2, and 3 respectively. For example, the ILD layer 710 may include an additive having a chemical structure that includes Si—C—C—Si bonds (or Si—X—Si bonds, where X is any number of carbon atoms). The ILD layer 710 may include an additive of bis(triethoxysilyl)ethene, 1-(triethoxysilyl)-2-(diethoxymethylsilyl)ethene, bis(diethoxymethylsilyl)ethene, and/or bis(diacetoxymethyl)ethylenesilane. In an embodiment, the additive includes terminal Si—CH$_3$ groups.

Thus, the ILD layer 710 may have a dielectric constant between approximately 2.2 and 2.7. The ILD layer 710 may have a hardness between approximately 1.5 and approximately 3.0 GigaPascals (GPa). Thus, the ILD layer 710 may be resistant to de-lamination after CMP processes and/or cracking during or after packaging the semiconductor device 700. Furthermore, in the formation of the contacts 706, the sidewalls 712 may suffer decreased damage due to the etching (e.g., plasma) processing.

The ILD layer 710 may include an increased carbon content as compared to conventional ILD layers due to the Si—C—C—Si (or Si—X—Si, where X is a number of carbon atoms) bridge structure and/or Si—CH$_3$ terminal groups of the additive included in the ILD layer 720. The carbon content may be increased approximately 10% to approximately 30% over the conventional ILD materials. The hardness of the ILD layer 710 may be increased between approximately 20% and 40% as compared to conventional ILD materials. Furthermore, the ILD layer 710 may provide a dielectric constant of less than approximately 2.8. In an embodiment, the ILD layer 710 has a dielectric constant of approximately 2.2.

In summary, the methods and devices disclosed herein provide a low-k dielectric material with an additive, a method of forming such a material, a method of depositing such a material, a semiconductor device including such a material, and/or other embodiments and applications. In doing so, the present disclosure offers several advantages over prior art devices. Advantages of some embodiments of the present disclosure include a lower dielectric constant and/or an increased mechanical strength. The increased mechanical strength may include an increased hardness and/or resistance to de-lamination. One issue that may be improved by one or more embodiments described herein is the de-methylation of low-k dielectric films during plasma etching, which can cause damage (e.g., to sidewalls of the dielectric layer). It is understood that different embodiments disclosed herein offer different disclosure, and that they may make various changes, substitutions and alterations herein without departing from the spirit and scope of the present disclosure.

Thus, the present disclosure provides a material. The material includes a low dielectric constant material and an additive. The additive includes a compound having a Si—X—Si bridge, wherein X is a number of carbon atoms between 1 and 8. In an embodiment, the compound as a Si—C—C—Si bridge. The material may have a carbon content of greater than approximately 16% atomic concentration. In an embodiment, the low dielectric constant material is a porous dielectric. The dielectric constant of the material may be between approximately 1.8 and 2.6. In an embodiment, the compound having the Si—X—Si bridge is at least one of bis(triethoxysilyl)ethene, 1-(triethoxysilyl)-2-(diethoxymethylsilyl)ethene, bis(diethoxymethylsilyl)ethene, and bis(diacetoxymethyl)ethylenesilane.

In an example, the low dielectric constant material has a first dielectric constant, and the low dielectric constant combined with the additive has a second dielectric constant, and the second dielectric constant is lower than the first dielectric constant. In an example, the low dielectric constant material has a first carbon content amount, and the low dielectric constant combined with the additive has a second carbon content amount, and the second carbon content amount is at least 10% atomic concentration greater than the first carbon content amount.

In one example, the additive compound has the structural formula of FIG. 2 wherein X is —(CH$_2$)$_n$—, and R1 to R6 are one of an alkoxy, an alkyl, and a hydrogen. At least one of R1 to R6 may be a methyl group. In an embodiment, the compound includes at least one terminal Si—CH$_3$ group.

Also described is a method of depositing a layer on a substrate. The method includes depositing a dielectric material, where the dielectric material includes a low-k dielectric and an additive. The dielectric material has a dielectric constant less than approximately 3 and a carbon content greater than approximately 15% atomic concentration. In an embodiment, the depositing includes performing a plasma-enhanced chemical vapor deposition (PECVD) process. In an embodiment, the depositing includes performing a sol-gel process. In one example, the sol-gel process includes combining the low-k dielectric material with a porogen precursor, inorganic acid, surfactant, ethanol, and water.

The disclosure also describes a semiconductor device. The device includes a semiconductor substrate; a gate feature disposed on the semiconductor substrate; and a dielectric layer overlying the gate feature. The dielectric layer includes an additive having a compound with the structure formula of FIG. 2. In an embodiment, at least one of R1 to R6 is a $CH_3$ group. The dielectric layer may be an inter-layer dielectric. The dielectric layer may further include a porous low-k dielectric material. In an example, the dielectric layer has a carbon content greater than approximately 15% atomic concentration.

What is claimed is:

1. A material, comprising:
a low dielectric constant material; and
an additive, wherein the additive includes a compound having a Si—X—Si bridge, wherein X is a number of carbon atoms between 1 and 8, and a methyl group is directly bonded to at least one silicon atom of the Si—X—Si bridge.

2. The material of claim 1, wherein the material has a carbon content of greater than approximately 16% atomic concentration.

3. The material of claim 1, wherein X is two.

4. The material of claim 1, wherein the low dielectric material is a porous dielectric.

5. The material of claim 1, wherein the compound has the structural formula:

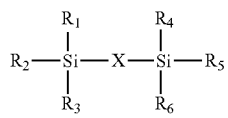

and R1 to R6 are one of an alkoxy, an alkyl, and a hydrogen.

6. The material of claim 5, wherein at least one of R1 to R6 is the methyl group.

7. The material of claim 1, wherein the dielectric constant is between approximately 1.8 and 2.6.

8. The material of claim 1, wherein the low dielectric constant material has a first dielectric constant, and the low dielectric constant combined with the additive has a second dielectric constant, and wherein the second dielectric constant is lower than the first dielectric constant.

9. The material of claim 1, wherein the low dielectric constant material has a first carbon content amount, and the low dielectric constant combined with the additive has a second carbon content amount, and wherein the second carbon content amount is at least 10% atomic concentration greater than the first carbon content amount.

10. The material of claim 1, wherein the compound is selected from the group consisting of: bis(triethoxysilyl) ethene, 1-(triethoxysilyl)-2-(diethoxymethylsilyl)ethene, bis(diethoxymethylsilyl)ethene, and bis(diacetoxymethyl)ethylenesilane.

11. A material, comprising:
a low dielectric constant material; and
an additive, wherein the additive includes a compound having a Si—X—Si bridge, wherein X is a number of carbon atoms between 1 and 8, wherein the compound includes at least one terminal Si—$CH_3$ group.

12. A method of depositing a layer on a substrate, comprising:
depositing a dielectric material, wherein the dielectric material includes a low-k dielectric and an additive, and wherein the dielectric material has a dielectric constant less than approximately 3 and a carbon content greater than approximately 15% atomic concentration; and wherein the additive includes a Si—X—Si bridge, wherein X is a number of carbon atoms greater than one, and a $CH_3$ group bonded to at least one silicon atom of the Si—X—Si bridge, thereby providing a Si—$CH_3$ structure.

13. The method of claim 12, wherein the depositing includes performing a plasma-enhanced chemical vapor deposition (PECVD) process.

14. The method of claim 12, wherein the depositing includes performing a sol-gel process.

15. The method of claim 14, wherein the sol-gel process includes combining the low-k dielectric material with a precursor, inorganic acid, surfactant, ethanol, and water.

16. A semiconductor device, comprising:
a semiconductor substrate;
a gate feature disposed on the semiconductor substrate; and
a dielectric layer overlying the gate feature, wherein the dielectric layer includes an additive having a compound with the structure formula:

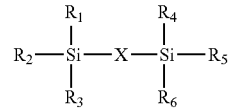

wherein X is —$(CH_2)n$—, n is 1 to 8, and R1 to R6 are one of an alkoxy, an alkyl, and a hydrogen, and wherein at least one of R1 to R6 is $CH_3$.

17. The semiconductor device of claim 16, wherein the dielectric layer is an inter-layer dielectric.

18. The semiconductor device of claim 16, wherein the dielectric layer further includes a porous low-k dielectric material.

19. The semiconductor device of claim 16, wherein the dielectric layer has a carbon content greater than approximately 15% atomic concentration.

* * * * *